US011380733B2

(12) United States Patent
Gelinck et al.

(10) Patent No.: US 11,380,733 B2
(45) Date of Patent: Jul. 5, 2022

(54) PHOTODETECTOR ARRAY AND METHOD OF MANUFACTURING THE SAME, AS WELL AS AN IMAGING DEVICE INCLUDING THE PHOTODETECTOR ARRAY (71) Applicant: Nederlandse Organisatie voor toegepast-natuurwetenschappelijk onderzoek TNO, s-Gravenhage (NL)

(72) Inventors: Gerwin Hermanus Gelinck, Valkenswaard (NL); Auke Jisk Kronemeijer, Eindhoven (NL); Jan-Laurens Pieter Jacobus Van Der Steen, Zaltbommel (NL)

(73) Assignee: Nederlandse Organisatie voor toegepast-natuurwetenschappelijk onderzoek TNO, 's-Gravenhage (NL)

( * ) Notice: Subject to any disclaimer, the term of this patent is extended or adjusted under 35 U.S.C. 154(b) by 251 days.

(21) Appl. No.: 16/625,378

(22) PCT Filed: Jun. 26, 2018

(86) PCT No.: PCT/NL2018/050411
§ 371 (c)(1),
(2) Date: Dec. 20, 2019

(87) PCT Pub. No.: WO2019/004823
PCT Pub. Date: Jan. 3, 2019

(65) Prior Publication Data
US 2021/0408125 A1 Dec. 30, 2021

(30) Foreign Application Priority Data

Jun. 26, 2017 (EP) .................................. 17177873

(51) Int. Cl.
*H01L 27/146* (2006.01)
*H01L 27/30* (2006.01)

(52) U.S. Cl.
CPC .......... *H01L 27/308* (2013.01); *H01L 27/307* (2013.01)

(58) Field of Classification Search
CPC ............. H01L 25/167; H01L 27/14643; H01L 27/3227; H01L 31/02024; H01L 31/0203;
(Continued)

(56) References Cited

U.S. PATENT DOCUMENTS 6,403,965 B1  6/2002 Ikeda et al.
2007/0262803 A1* 11/2007 Hales ..................... H03K 3/03
327/206

(Continued)

FOREIGN PATENT DOCUMENTS

EP   1942663 A1 * 7/2008 ............. H04N 5/335
TW   201631588 A     9/2016
WO   2012164259 A1  12/2012

OTHER PUBLICATIONS

Aug. 17, 2018, International Search Report and Written Opinion, PCT/NL2018/050411.

*Primary Examiner* — Samuel Park
(74) *Attorney, Agent, or Firm* — Banner & Witcoff, Ltd.

(57) ABSTRACT

A photodetector array (1) is provided comprising a plurality of pixels (10$_{ij}$) between a supply line (4*j*) and a common electrode (2). Respective pixels (10$_{ij}$) comprise a photon radiation sensitive element (11$_{ij}$) arranged in a series connection with a switching element (20$_{ij}$) characterized in that the series connection further includes a resistive element (30$_{ij}$).

14 Claims, 6 Drawing Sheets

(58) Field of Classification Search
CPC ............ H01L 31/0284; H01L 31/1032; H01L 31/107; H01L 27/308; H01L 27/307
See application file for complete search history.

(56) References Cited

U.S. PATENT DOCUMENTS

| | | | |
|---|---|---|---|
| 2015/0035103 A1 | 2/2015 | Inoue | |
| 2015/0288898 A1 | 10/2015 | Yazawa et al. | |
| 2015/0340401 A1 | 11/2015 | Yoshii et al. | |
| 2015/0349184 A1* | 12/2015 | Hsu | H01L 31/108 257/26 |
| 2016/0126284 A1 | 5/2016 | Kato et al. | |
| 2016/0341664 A1* | 11/2016 | Rothberg | H01L 27/14603 |
| 2017/0301716 A1* | 10/2017 | Irish | H01L 27/14641 |

* cited by examiner

PHOTODETECTOR ARRAY AND METHOD OF MANUFACTURING THE SAME, AS WELL AS AN IMAGING DEVICE INCLUDING THE PHOTODETECTOR ARRAY

CROSS-REFERENCE TO RELATED APPLICATIONS

This application is a U.S. National Stage application under 35 U.S.C. § 371 of International Application PCT/NL2018/050411 (published as WO 2019/004823 A1), filed Jun. 26, 2018, which claims the benefit of priority to Application EP 17177873.1, filed Jun. 26, 2017. Benefit of the filing date of these prior applications is hereby claimed. Each of these prior applications is hereby incorporated by reference in its entirety.

BACKGROUND OF THE INVENTION

Field of the Invention

The invention relates to a photodetector array.
The invention further relates to a method of manufacturing the same.
The invention still further relates to an imaging device including such a photodetector array.

Related Art

Thin film photodetector based imagers have the potential to be very thin, light and flexible. Moreover, a substantial reduction in production cost can be achieved, in particular for organic photodetector technology, as this allows relatively simple deposition and processing methods. Additional cost savings are achieved in that a fine-pitch patterning of the organic photodetector film and its top electrode in a large-area image sensor can be avoided. This may lead to a significant cost-savings compared to a-Si diodes.

A disadvantage of this process simplification is its vulnerability to fatal failure and defects. As the photodiode is now a large diode and consists of a very thin (normally less than 500 nm) active layer between the anode and the cathode electrode, abrupt failure during operation is one of the main reliability and yield issues. Tiny defective points are hardly avoidable even in the controlled cleanrooms. Some of these defects can cause abrupt electrical short and/or failure of a large part of the detector. Leakage channels formed around these defective sites may cause heat generation and this enhances the current density around the sites. As the resistivity of the site is lowered, current of the whole detector is concentrated to the site, lowering the sensitivity of the whole panel. Or, the defect causes direct electrical shorts between the defective site and the readout electronics, damaging the (ultra-sensitive) peripheral silicon charge sense amplifiers.

SUMMARY OF THE INVENTION

It is an object of the invention to provide a photodetector array wherein this disadvantage is at least mitigated. It is a further object of the invention to provide a method of manufacturing such a photodetector array.

According to a first aspect of the invention, a photodetector array is provided that comprises a plurality of pixels between a supply line and a common electrode. Respective pixels comprise a photon radiation sensitive element arranged in a series connection with a switching element. The series connection further includes a resistive element.

In the inadvertent case that a photodiode in the photodetector array contains a defect and this happens to cause an electrical short of the photodiode, the current of the pixel containing this photodiode is limited to the level designed by the thin-film resistor and therewith at least mitigates damage that could result otherwise result to surrounding pixels.

In an embodiment the resistive element has a resistive value in the range of 0.05 to 0.2 times a normal resistive value of the switching element in its conductive state. Therewith not only a risk of damage is mitigated, but additionally it is achieved that a potential defect of a photodiode of a pixel affects performance of the neighboring pixels. Minor changes in performance could still be compensated by image processing methods applied to the retrieved image signals. Image processing methods may further be applied to estimate a correct value for an image signal obtained from a pixel with a defect photodiode.

The normal resistive value of the switching element in its conductive state is defined as the resistive value it is designed to have in its conductive state. In view of the fact that in practice at least a majority of the switching elements will perform as designed, the normal resistive value is approximately equal to the average value or the median value of the resistive values of the switching elements in their conductive state.

In an embodiment of the photodetector array according the first aspect, the resistive element is a thin film resistor. This is advantageous in particular if it desired that the photodetector array has a small thickness. Various options are available to provide a thin film resistor for this purpose.

For example, in an embodiment, each thin-film resistor is provided in a vertical interconnect area of each photon radiation sensitive element. In particular this may be achieved in that a surface of a connector for electrically connecting the photon radiation sensitive element with the switching element is oxidized in the vertical interconnect area.

In another embodiment a controllable channel of the switching element and the thin-film resistor respectively are formed in a first and a second region of a continuous portion of a layer of semiconductor material and wherein these regions are mutually differently doped to provide that a resistive value of the first region has a resistive value that is higher than a resistive value of the second region in a conductive state of the switching element, and lower than a resistive value of the second region in a non-conductive state of the switching element.

In again another embodiment the resistive element is formed as a portion with a restricted cross-section in an electrically conductive element in said series connection. The restricted cross-section may for example be a restricted cross-section of a via through an insulating layer. A higher resistive value can be obtained with a higher value for the thickness of the insulating layer or a lower value for the cross-sectional area. A lower resistive value can be obtained with a lower value for the thickness or a higher value for the cross-sectional area. Alternatively the restricted cross-section may be obtained as a restriction of a width of a conducting line in the series connection. A higher resistive value can be obtained with a higher value for a length of the restriction or a lower value for a width of the restriction. A lower resistive value can be obtained with a lower value for the length or a higher value for the width. Instead of modifying a width, alternatively a thickness of the conducting line may be modified, or a combination of such modifications is possible. In practice it is however easier to modify a width than a thickness.

In an embodiment, the photon radiation sensitive elements include a photon radiation sensitive layer of an organic material.

In an embodiment the photon radiation sensitive elements are sensitive for X-ray radiation.

According to a second aspect of the invention, an imaging device is provided. The imaging device comprises a photodetector array according to the first aspect for example in one of the embodiments presented above. Therein the supply line of the photodetector array is one of a plurality of supply lines and a respective plurality of pixels is coupled between each supply line and the common electrode. More in particular the plurality of supply lines are column lines driven by a column driver. The imaging device further comprises a plurality of row lines driven by a row driver and a respective pixel of each plurality of pixels has a control electrode of their switching element coupled to a respective one of the row lines.

According to a third aspect of the invention, a method of manufacturing a photodetector array according to the first aspect is provided.

The method of manufacturing an organic photodetector array, comprises the steps of providing the substrate, providing a first stack of layers, and providing a second stack of layers as defined below.

The substrate that is provided may optionally include an insulating layer, dependent on the material used for the substrate and user requirements.

In providing the first stack of layers at least one supply line is formed as well as a plurality of switching elements forming a respective controllable electrically conductive channel between the at least one supply line and respective electric contacts. Also the first stack of layers forms a plurality of control lines for controlling respective ones of the plurality of switching elements to control an electrical connection between the at least one supply line and the respective electric contacts.

In providing the second stack of layers, comprising at least a photon radiation sensitive layer, respective photon radiation sensitive zones are defined that are electrically connected to respective ones of the electric contacts at a first side of the at least a photon radiation sensitive layer. Providing the second stack of layers further includes providing a transparent electrically conductive layer that forms a common electrode on a second side of the at least a photon radiation sensitive layer opposite the first side.

In the method of manufacturing according to the third aspect, a respective controllable electrically conductive path is formed between the at least one supply line and the common electrode via a respective switching element and a respective photon radiation sensitive zone. In the method of manufacturing according to the third aspect these controllable electrically conductive paths are provided with a respective series resistance.

In an exemplary embodiment the method comprises, subsequent to providing the first stack of layers and before providing the second stack of layers the additional step of providing a first intermediary patterned layer of an insulating material that defines respective openings towards the respective contacts, as well as the additional step of forming a respective series resistance for the controllable electrically conductive paths by applying a surface treatment to the respective contacts within said openings. When providing the second stack of layers a first layer of the second stack protrudes into the respective openings to form an electric contact with the respective contacts exposed therein.

The surface treatment may include an oxidization step, for example including exposure of the exposed contacts to a plasma. Alternatively, the surface treatment may include the formation of a self assembled monolayer on top of the exposed respective contacts.

In another exemplary embodiment the method comprises subsequent to providing the first stack of layers and before providing the second stack of layers providing a first and a third intermediary patterned layers of an insulating material and providing a second intermediary patterned layer of an electrically conductive material.

The first intermediary patterned layer of an insulating material defines respective openings towards said respective contacts.

When providing the second intermediary patterned layer of an electrically conductive material the electrically conductive material is allowed to penetrate the openings and to contact the respective contacts within the openings. Therewith the electrically conductive material of the second intermediary patterned layer in the openings forms a respective series resistance for the controllable electrically conductive paths determined by the thickness of the first intermediary patterned layer and the cross-sectional area of the openings.

The third intermediary patterned layer of an insulating material is provided with second openings extending towards the second intermediary patterned layer. When providing the second stack of layers comprising a first layer of the second stack protrudes into the second openings to form respective electric contacts with the second intermediary patterned layer.

In another exemplary embodiment the method comprises before providing the second stack of layers the step of selectively modifying a target layer from the first stack of layers that forms the respective controllable electrically conductive channels. Therewith it is achieved that a respective portion of the layer that connects a respective controllable electrically conductive channel with the at least one supply line and/or a respective portion of said layer that connects a respective controllable electrically conductive channel with a respective electric contacts has a higher specific resistance as compared to that of the respective controllable electrically conductive channels. Such modification may be achieved in that the target layer is selectively doped, for example by at least one of oxidizing, reducing atmospheres, plasma treatment.

In another embodiment, wherein the common electrode is an anode of Indium Gallium Zinc Oxide the common electrode is selectively doped by one or more of H2 doping, deep UV illumination, Ca-based treatment outside these regions for a reduction of electrical resistance, to achieve that a local value of a resistance of the common electrode in regions defined by the photon radiation sensitive elements is higher than a value of a resistance of the common electrode outside these regions.

Any combination of the measures presented above may be applied. For example a protective resistive means in a path from the supply line via the switching element and via the photon radiation sensitive element to the common electrode may be provided by a combination of two or more resistive elements in various positions in the path, for example two or more of a resistive element at a position between the supply line and the switching element, at a position between the switching element and the photon radiation sensitive element and at a position between the photon radiation sensitive element and the common electrode.

BRIEF DESCRIPTION OF THE DRAWINGS

These and other aspects are described in more detail with reference to the drawing. Therein.

DESCRIPTION OF EMBODIMENTS

Figure 1:
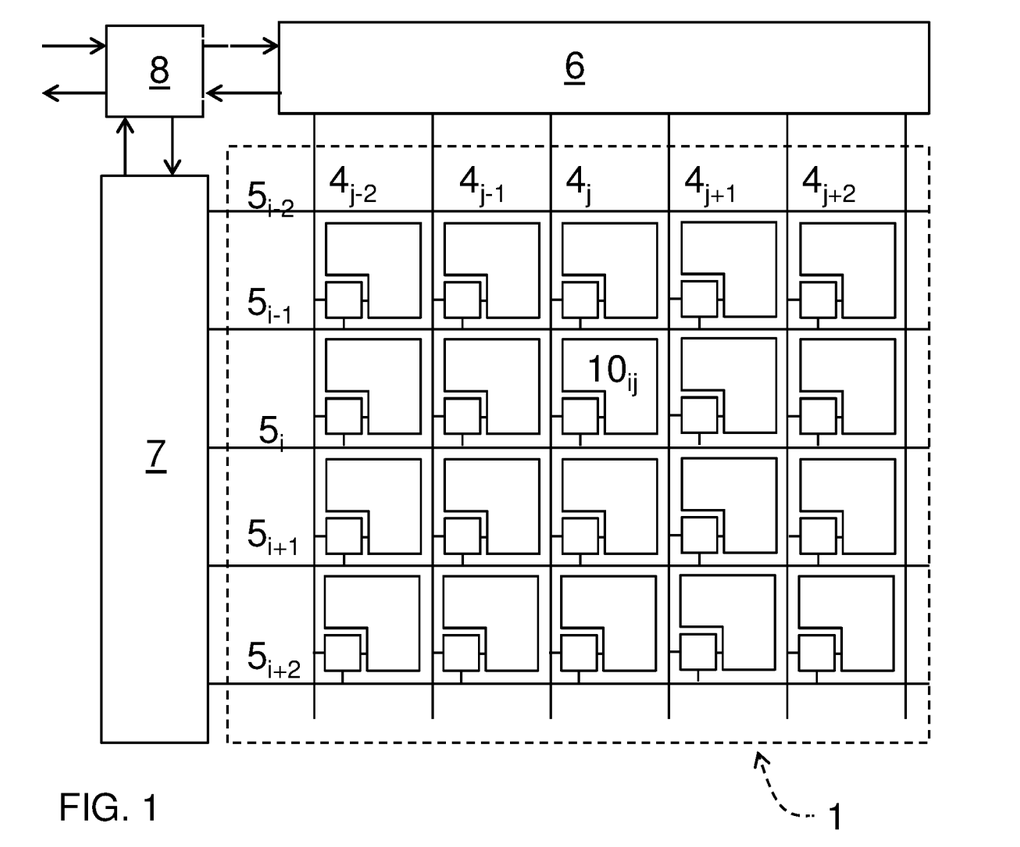
FIG. 1 schematically shows an embodiment of an imaging device according to the second aspect, FIG. 2 schematically shows a portion of an embodiment of a photodetector array according to the first aspect, which may be part of an imaging devices as shown in FIG. 1.

FIG. 1 schematically shows an imaging device comprising a photodetector array 1 according to an embodiment of the present invention. The imaging device further includes a column driver 6, a row driver 7 and main processing unit 8. The photodetector array 1 comprises a plurality of pixels $10ij$. Each column j of pixels is connected to a respective column electrode $4_j$ controlled by column driver 6 and each row i of pixels is connected to a respective row electrode $5_i$ to the row driver 7. For clarity, this example presents an imaging device with only 5 rows, 5 columns and 25 pixels arranged in the photodetector array 1. In practice a substantially higher number of rows, columns and pixels may be present, e.g. in the order of thousands of rows and columns and millions of pixels. Also other arrangements may be used instead of the rectangular grid arrangement. For example alternatively, the pixels may be arranged in a hexagonal grid, or in a polar grid having radially arranged electrodes instead of row electrodes and circularly arranged electrodes instead of the column electrodes.

Figure 1A:
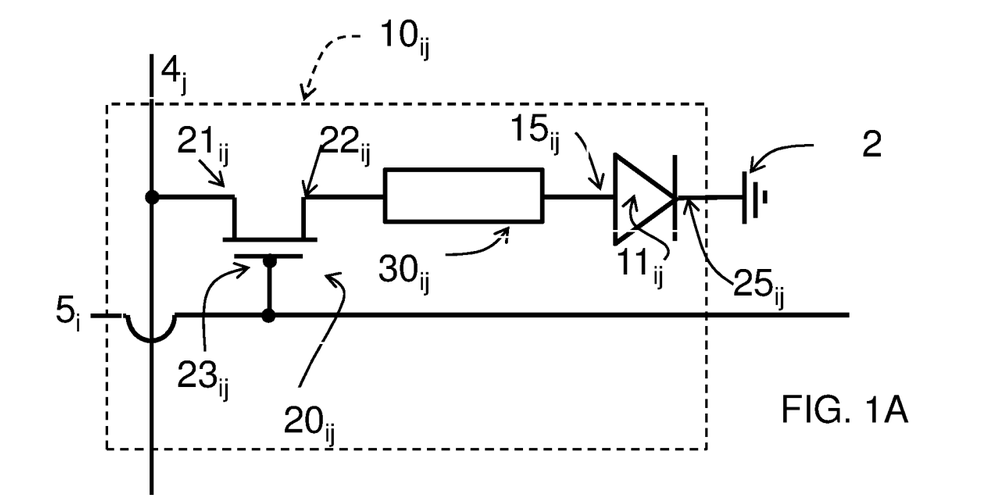

FIG. 1A schematically shows electric components of one pixel $10_{ij}$ of the photodetector array 1 of the embodiment of FIG. 1 in more detail. As shown therein the pixel $10_{ij}$ comprises a photon radiation sensitive element $11_{ij}$ with a first terminal $15ij$ coupled via a switching element $20ij$ to a supply line, column electrode $4j$ and with a second terminal $25ij$ coupled to a common electrode 2. Typically all pixels in the photodetector array are connected to this common electrode 2, but alternatively it may be contemplated to have several common electrodes, one for each of a subset of pixels in the photodetector array 1. FIG. 1A further shows that the switching element $20ij$ is coupled with its control electrode $23ij$ to row electrode $5_i$.

In operation row driver 7 selectively activates one of the row electrodes, for example row electrode $5_i$, therewith setting the switching elements connected thereto, in this example including switching element $20ij$, in a conductive state. This enables the column driver 6 to detect a magnitude of a current through its column electrodes, e.g. column electrode j. The current through column electrode j in this example is indicative for an intensity of radiation, e.g. X-ray radiation, impingent upon the photon radiation sensitive element $11ij$. Main processing unit 8 may receive output signals from column driver 6, representative for the detected magnitudes. The plurality of signals for the detected magnitudes for each of the pixels represents image data. As is further shown in FIG. 1A, the first terminal $15ij$ of the photon radiation sensitive element $11ij$ is coupled via a resistive element $30ij$ to, a second main electrode $22ij$ of, the switching element $20ij$. The resistive element $30ij$ may for example have a resistive value in the range of 0.05 to 0.2 times a normal resistive value of the switching element $20ij$ in its conductive state. If in an inadvertent case the photon radiation sensitive element $11ij$ were defect and formed a shortcut, the resistive element $30ij$ provides for a limitation of the current photon radiation sensitive element $11ij$ that at least mitigates damage to neighboring pixel elements. A substantially higher resistive value of the resistive element, e.g. higher than 0.4 times a normal resistive value of the switching element $20ij$ in its conductive state would provide no additional protection and could negatively affect performance. Whereas in this embodiment the resistive element $30ij$ is arranged between the first terminal $15ij$ of the photon radiation sensitive element $11ij$ and the switching element $20ij$ a resistive element may alternatively provided in another position in series with the photon radiation sensitive element $11ij$, for example between the column line and a first main electrode $21ij$ of the switching element, or between the second terminal $25ij$ of the photon radiation sensitive element $11ij$ and the common electrode 2.

Figure 2:
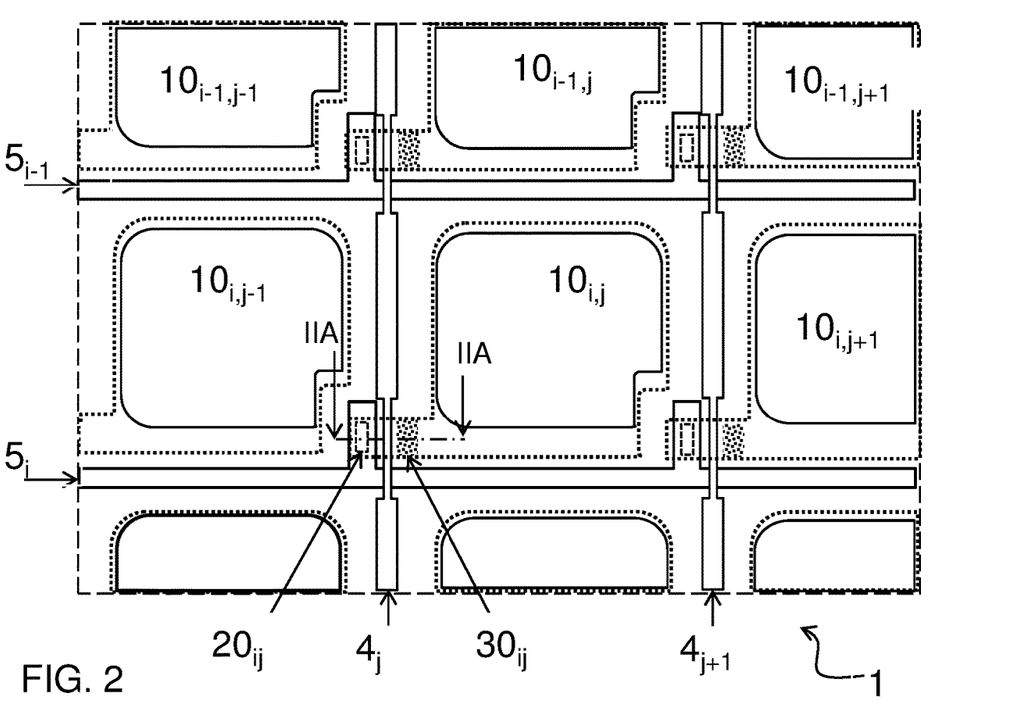
Figure 2A:
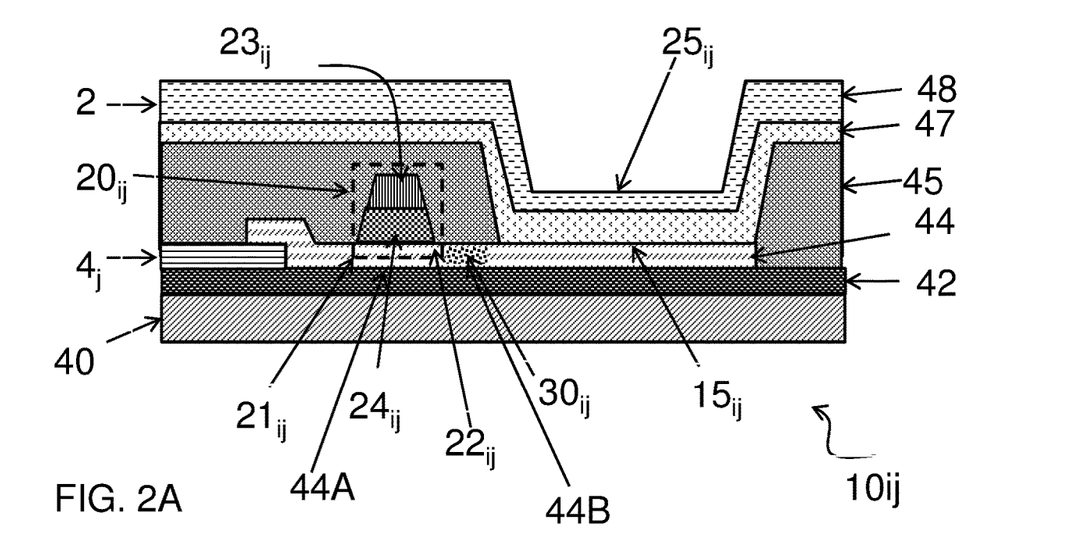
FIG. 2A shows a cross-section according to IIA-IIA of FIG. 2.

FIG. 2 schematically shows a portion of a photodetector array 1 in an embodiment according to the first aspect of the invention. FIG. 2A shows a cross-section according to IIA-IIA of FIG. 2. Elements corresponding to those in FIG. 1, 1A have the same reference number.

In the exemplary embodiment of FIGS. 2, 2A, the photodetector array 1 is provided on a substrate 40, for example of a glass, a polymer or a metal layer. The substrate may be provided with a continuous insulating layer 42, e.g. an inorganic insulating layer, e.g. of ceramic material like SiO2 or SiN2 or an organic layer. Upon the substrate 40 with the optional continuous insulating layer 42 a plurality of column lines, e.g. 4j, 4j+1 is formed of a metal, for example MoCr, or another metal like Al, Cu are formed. The semiconductor is patterned to form elements that extend from a first contact position with column line, e.g. 4j, towards a second contact position with an optical detection layer 47. In practice an optical detection layer 47 may be a single layer or a stack of sub-layers. A region 44A of the semiconductor pattern element forms a controllable channel of switching element $20ij$. The channel has first electrode, e.g. source electrode $21ij$ and second electrode, e.g. source electrode $22ij$. A gate electrode $23ij$ insulated by gate insulator $24ij$ of the switching element $20ij$ are formed respectively as an element in a further patterned metal layer and in a further patterned insulating layer. In the embodiment shown a further patterned insulating layer 45 is formed that defines openings towards respective elements of the patterned semiconductor layer 44. Therewith optical detection layer 47 electrically contacts these elements in these openings. A transparent electrically conductive layer 48 forms, e.g. from indiumtinoxide (ITO) forms the common electrode 2. The transparency of this layer may for example be at least 50%, at least 75%, or at least 90% in the wavelength range of interest. In an embodiment an electrically conductive grid may be arranged on the transparent electrically conductive layer. The grid may for example be formed as a mesh of metal wires that are arranged above the row conductors 5 and the column conductors 4, so that they do not occlude the pixels 10ij. A region 44B is formed in the semiconductor pattern element of the patterned semiconductor layer 44, wherein regions 44A, 44B form a continuous portion. Region 44B is doped different from region 44A. Therewith it is achieved that a resistive value of the second region 44B has a resistive value that is higher than a resistive value of the first region 44A in a conductive state of the switching element 20ij, and lower than a resistive value of the first region 44A in a non-conductive state of the switching element 20ij.

Various methods are available to locally dope the first regions to reduce its sheet resistance. Examples thereof are H2 doping, deep UV illumination, and Ca-based treatment. Alternatively it is possible to locally reduce a doping level. In addition to, or as an alternative for controlling the amount of doping, standard lithographic techniques may be applied to e.g. fabricate restrictions in the semiconductor material. Using one or more of these approaches, the actual resistance of the thin-film resistor can be tuned. In embodiments, the resistive value of the second region 44B is in a range of 0.05 to 0.2 times (for example 0.1 times) a normal resistive value of the switching element 20ij in its conductive state.

Figure 2B:
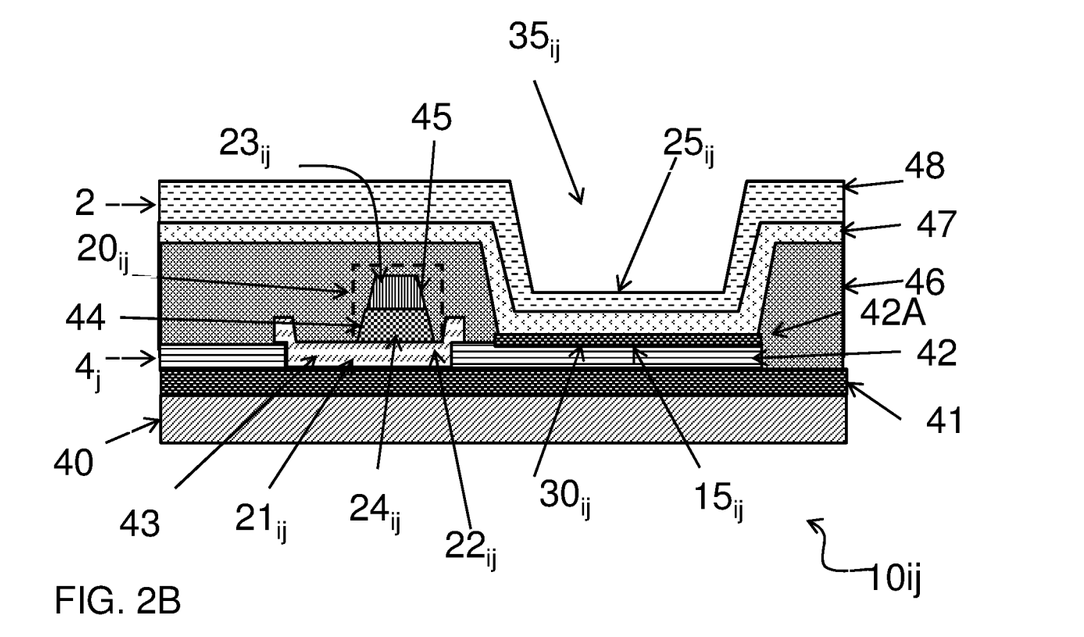
FIG. 2B shows according to the same cross-section a portion of an alternative embodiment of the photodetector array.

Another embodiment is illustrated in FIG. 2B. Parts therein corresponding to those in FIG. 1, 1A or FIG. 2, 2A have the reference numeral. In this example, the thin-film resistor 30ij is provided in a vertical interconnect area 35ij of a photon radiation sensitive element. In the embodiment shown, the thin-film resistor 30ij is provided in the vertical interconnect area 35ij in that a surface 43A of a connector for electrically connecting the photon radiation sensitive element with the switching element is oxidized in said area. In an embodiment this is part of a post-processing step. For example, after opening of via's in an interlayer dielectric, the exposed metal in the via's is exposed to an oxygen plasma in order to oxidize the surface of the metal. Therewith a linear resistance of the surface of the metal may be increased from a value of for example about 100 Ohm, to a non-linear resistance in a range of about 30 kOhm to about ~1 MOhm.

Figure 2C:
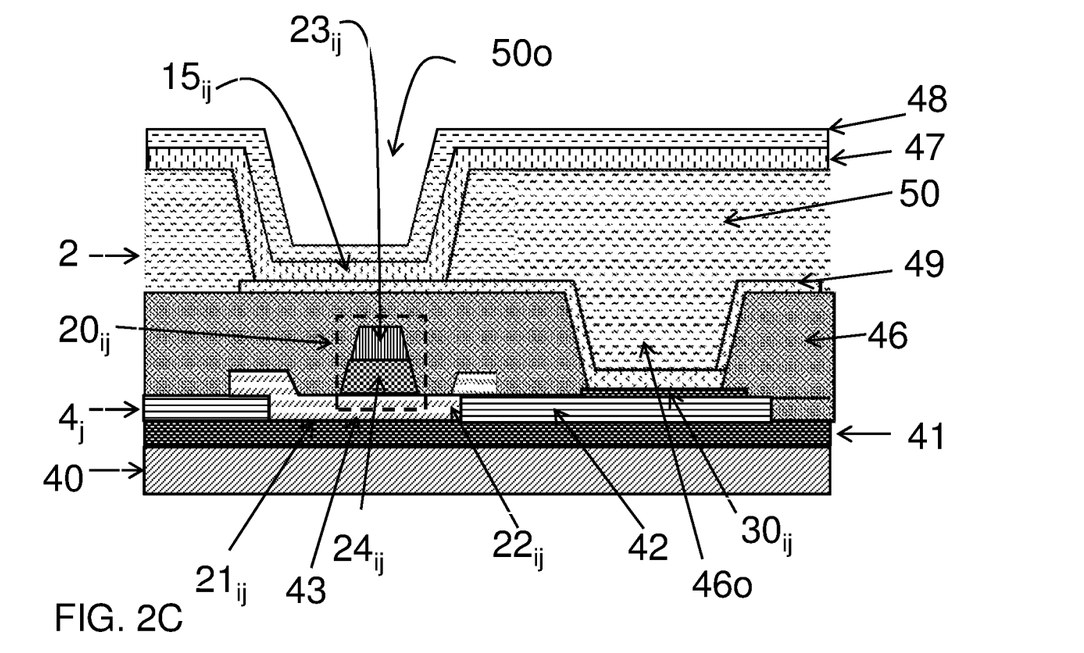
FIG. 2C shows according to the same cross-section a portion of a further alternative embodiment of the photodetector array.

In another embodiment, shown in FIG. 2C, an electric connection between a switching element 20ij and a contact 15ij with the photon radiation sensitive layer 47 is formed using an additional patterned layer 49 of an electrically conductive material. As shown in FIG. 2C, the additional patterned layer 49 is arranged on top of a first intermediary patterned layer 46 of an insulating material that defines respective openings 46o towards respective contacts of the layer 42. The additional patterned layer 49 forms a respective series resistance for the controllable electrically conductive path to the contact 15ij that is determined by the thickness of the first intermediary patterned layer 46 and the cross-sectional area of the openings 46o. The photon radiation sensitive layer 47 on its turn is connected to the additional patterned layer 49, in this embodiment via openings 50o in patterned insulating layer 50 that forms a second intermediary patterned layer. In another embodiment the photon radiation sensitive layer 47 may for example extend beyond an edge of the patterned insulating layer 50 to contact the first intermediary patterned layer 46. A higher resistive value can be obtained with a higher value for the thickness or a lower value for the cross-sectional area. A lower resistive value can be obtained with a lower value for the thickness or a higher value for the cross-sectional area.

It is noted that the above-mentioned embodiments are not mutually exclusive. For example a protective resistive means in a path from the supply line via the switching element and via the photon radiation sensitive element to the common electrode may be provided by a combination of two or more resistive elements in various positions in the path, for example two or more of a resistive element at a position between the supply line and the switching element, at a position between the switching element and the photon radiation sensitive element and at a position between the photon radiation sensitive element and the common electrode.

FIG. 3A-3I shows steps of an embodiment of a method of manufacturing an organic photodetector array according to the present invention. The method comprises the following subsequent steps.

In this connection it is noted that the wording "providing a (patterned) layer" is intended to refer to any step or sequence of steps that results in the specified layer.

The inorganic layers may be provided by all kinds of physical vapour deposition methods such as thermal evaporation, e-beam evaporation, sputtering, magnetron sputtering, reactive sputtering, reactive evaporation, etc. and all kinds of chemical vapour deposition methods such as thermal chemical vapour deposition (CVD), photo assisted chemical vapour deposition (PACVD), plasma enhanced chemical vapour deposition (PECVD), etc.

Organic layers may be applied by all kinds of coatings techniques, such spin coating, slot-die coating, kiss-coating, hot-melt coating, spray coating, etc. and all kinds of printing techniques, such as inkjet printing, gravure printing, flexographic printing, screen printing, rotary screen printing, etc.

For example a layer may be provided by printing, coating, sputtering, chemical vapor deposition, physical vapor deposition and the like. Providing a layer may further include subsequent steps like curing and drying. A patterned layer may be provided by a subsequent patterning stage of an initially homogeneously deposited layer, but alternatively a deposition method may be used that directly provides a patterned layer, e.g. by printing or a deposition method using a shadow mask. Also it may be contemplated to apply a further patterning step to an already patterned layer.

Depending on specific requirements the materials to be used may be of an organic or of an inorganic nature. Often use of organic materials may be preferred, as this allows relatively simple deposition and processing methods.

The substrate may for example be of an organic material, such as a polymer, but may alternatively be of an inorganic material, such as a glass or a metal.

Metals, e.g. Al, Au, Cu, Mo, or alloys thereof may be used as an electrically conductive material, but alternatively conducting polymers may be used for this purpose, also conducting compositions of organic and inorganic components may be used. Transparent electrically conductive structures may be provided from a material such as polyaniline, polythiophene, polypyrrole or doped polymers. Apart from organic materials, various inorganic transparent, electrically conducting materials are available like ITO (Indium Tin Oxide), IZO (Indium Zinc Oxide), ATO (Antimony Tin Oxide), or Tin Oxide can be used. Other metal oxides can work, including but not limited to Nickel-Tungsten-Oxide, Indium doped Zinc Oxide, Magnesium-Indium-Oxide. Insulating layers may be of an inorganic material, such as a ceramic material or of a polymer.

As a semiconductor material for the switching elements 20ij inorganic materials like IGZO (Indium Gallium Zinc Oxide) or hydrogenated amorphous silicon (a-Si:H) may be used. Alternatively semiconducting polymer materials like P3HT, IDTBT?, N2200 are suitable.

The photon radiation sensitive layer may for example be provided as a bulk-heterojunction or bilayer of a p-type and an n-type organic materials, for example bulk-heterojunction P3HT:PC$_{61}$BM.

Perovskites, like organolead trihalide perovskites (CH3NH3PbI3) are also applicable as for use as a photodetector in the photon radiation sensitive layer. Ding discusses these materials in "High-quality inorganic-organic perovskite CH3NH3PbI3 single crystals for photo-detector applications", J Mater Sci (2017) 52:276-284. See also Wei et al. "Sensitive X-ray detectors made of methylammonium lead tribromide perovskite single crystals" published online: 21 Mar. 2016|DOI: 10.1038/NPHOTON.2016.41

In an other embodiment the photon radiation sensitive layer comprises one or more of photosensitive materials from the groups of sulfides like PbS, InS, selenides and oxides e.g. ZnO. These materials may be either provided as a thin film or as particle/quantum dot configuration, as is for example described in Konstantatos et al. "Colloidal quantum dot photodetectors", Infrared Physics & Technology 54 (2011) 278-282. See also Buda et al. "Characterization of high performance PbS photodetectors"

Still alternatively the photon radiation detection layer may be selenium based, see for example Pace et al.: printed photodetectors, Semicond. Sci. Technol. 30 (2015) 104006.

Optionally the photon radiation sensitive layer may be provided as a combination of two or more of the above.

Figure 3A:
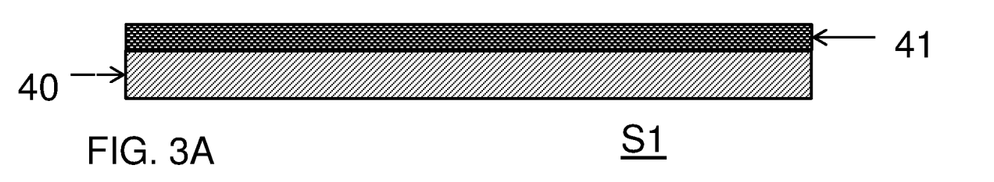
FIG. 3A-3I show subsequent steps of an embodiment of a method of manufacturing according to the third aspect.

Therein FIG. 3A shows a first step, wherein a substrate 40 is provided. Optionally the substrate may be covered by an insulating layer 41. For example if the substrate 40 is of a metal, an insulating layer 41 may be provided thereon to insulate elements to be arranged on the substrate 40 from the metal. Alternatively, if the substrate 40 itself is of an insulating material, such as glass or a polymer, an additional insulating layer 41 may be superfluous.

Figure 3B:
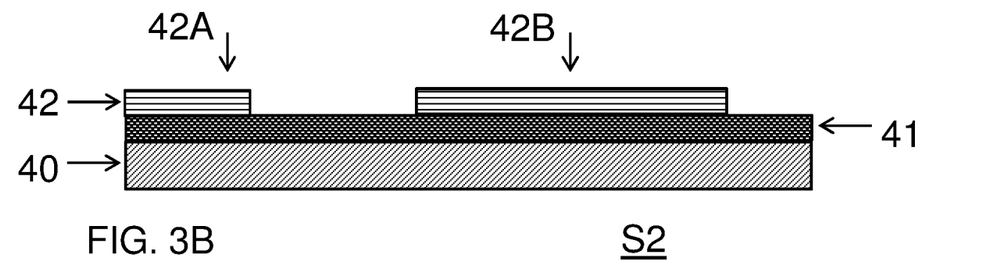
Figure 3C:
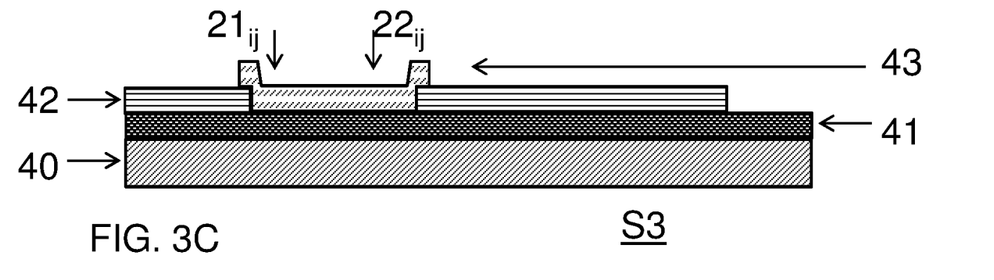

FIG. 3B shows a second step S2 wherein a first patterned layer 42 of an electrically conductive material is provided to form a supply line (See 4$j$ in FIG. 1, 1A) and an electrical connection from the supply line (formed by a portion 5A) to a switching element. In addition this first patterned layer is to form an electrical connection (by portion 42B) towards an associated photon radiation sensitive element to be formed, FIG. 3C shows a third step S3 wherein a second patterned layer 43 of a semiconductor is provided that contacts the electrical connections formed by the first patterned layer 42. These contacts with the portions 42A and 42B of the first patterned layer define a first and a second electrode 21$ij$, 22$ij$.

The semiconductor used for this purpose is preferably IGZO as its electrical properties can be easily modified by various processes. For example, this semiconductor can be doped in various ways (such as H2 doping, deep UV illumination, Ca-based treatment) to yield a material layer with a low sheet resistance.

In the so-called Self-Aligned IGZO TFT technology, local regions of deposited IGZO material are selectively (highly) doped, while other regions of the same material are kept 'intrinsic'. The selective doping can be used to implement a high-resistance IGZO region in the TFT backplane to realize the thin-film resistor in the TFT pixel. By controlling the amount of doping, in combination with standard lithographic techniques to e.g. fabricate restrictions in the IGZO material, the actual resistance of the thin-film resistor can be tuned.

Figures 3D, 3E:
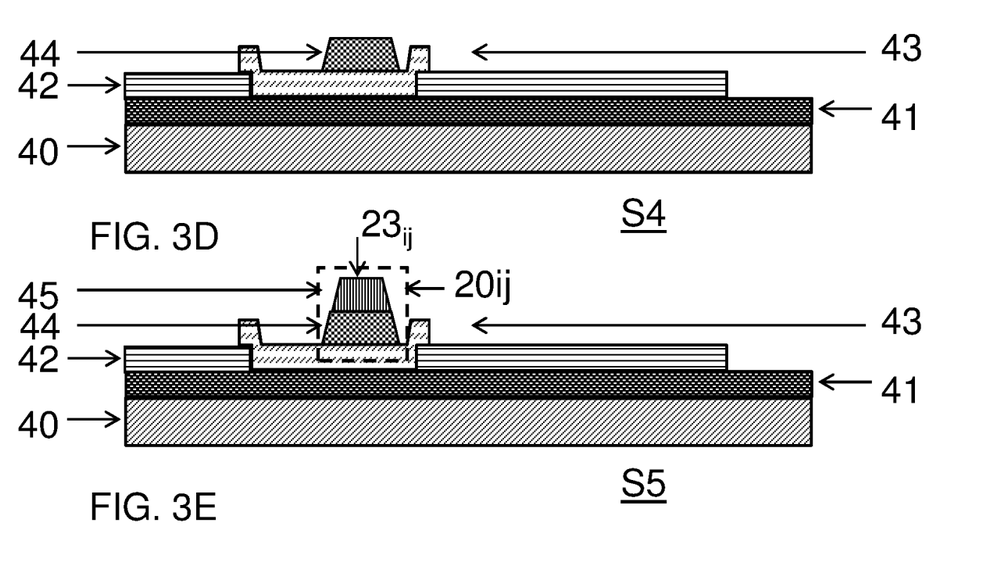

FIG. 3D shows a fourth step S4 wherein a third patterned layer 44 is provided. This third patterned layer, which is of an insulating material, such as SiO2 or SiN2 forms a gate insulator.

As shown in FIG. 3E, in a fifth step S5 a fourth patterned layer 45 is formed of an electrically conductive material to form a control line (See 5$i$ in FIG. 1, 1A), and that overlaps an area defined by the third patterned gate insulation layer 44 to form a gate electrode 23$ij$, and further to provide an electrical connection from the control line 5$i$ to the gate electrode 23$ij$. Element 20$ij$ defines the thin film transistor comprising this gate electrode 23$ij$ and the first and a second electrode 21$ij$, 22$ij$ of step S3.

In a further improvement of this embodiment, steps 3D and 3E may be combined in a single processing step in the so-called Self-aligned IGZO TFT technology.

Figure 3F:
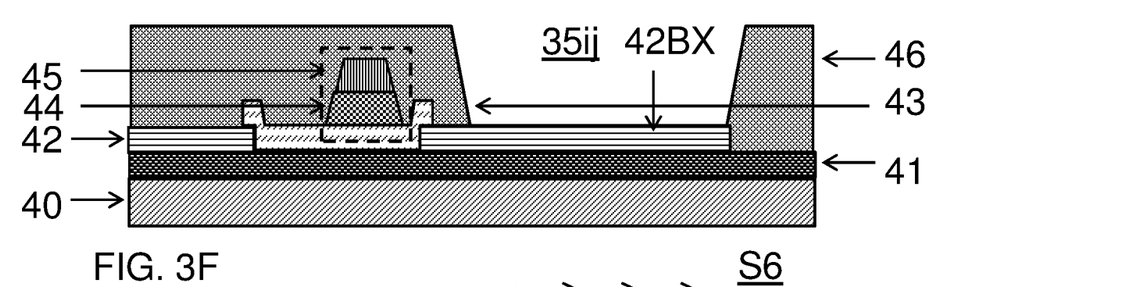

In step S6, shown in FIG. 3F, a fifth patterned layer 46 is formed which is of an insulating material and defines an opening 35$ij$ extending towards the first patterned layer 45. Therewith a surface portion 42BX of the first patterned layer is exposed in opening 35$ij$.

Figure 3G:
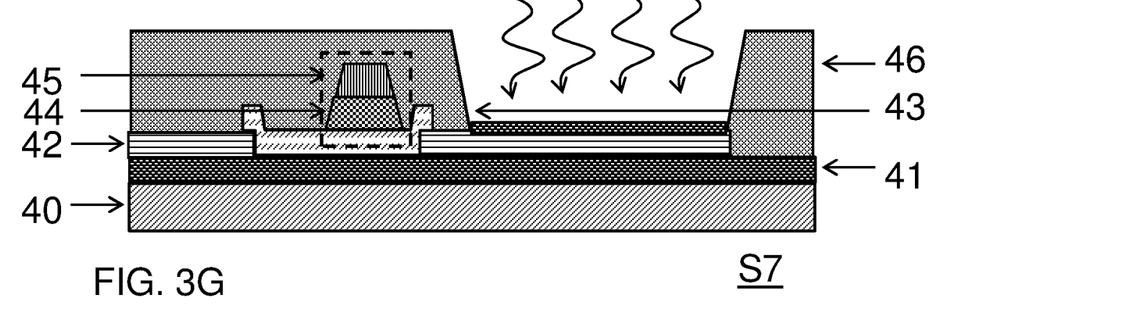

In step S7, shown in FIG. 3G, the exposed surface portion 42BX is modified to increase its surface resistance. In an embodiment the exposed surface portion is oxidized by an oxygen plasma.

Figure 3H:
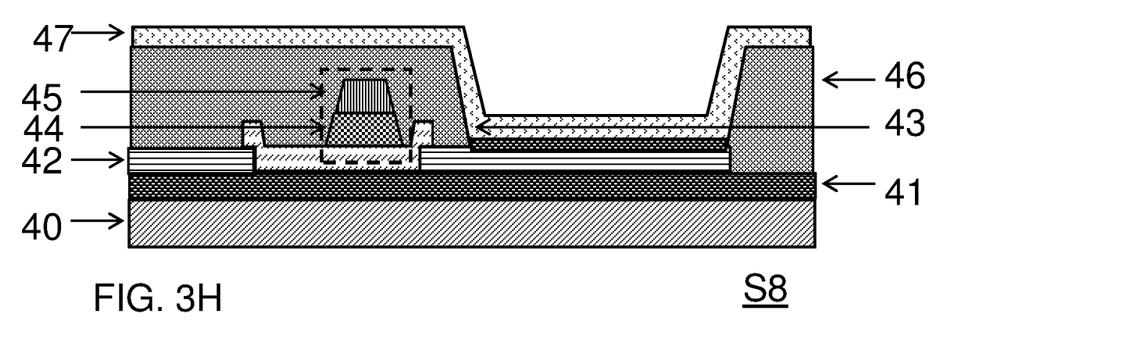

In step S8, shown in FIG. 3H, an optically active layer 47 is provided that protrudes into the opening 35$ij$ to form an electric contact with the exposed surface portion 42BX of the first patterned layer 45. The optically active layer 47 may be formed as a single layer or as a stack of two or more sublayers.

Figure 3I:
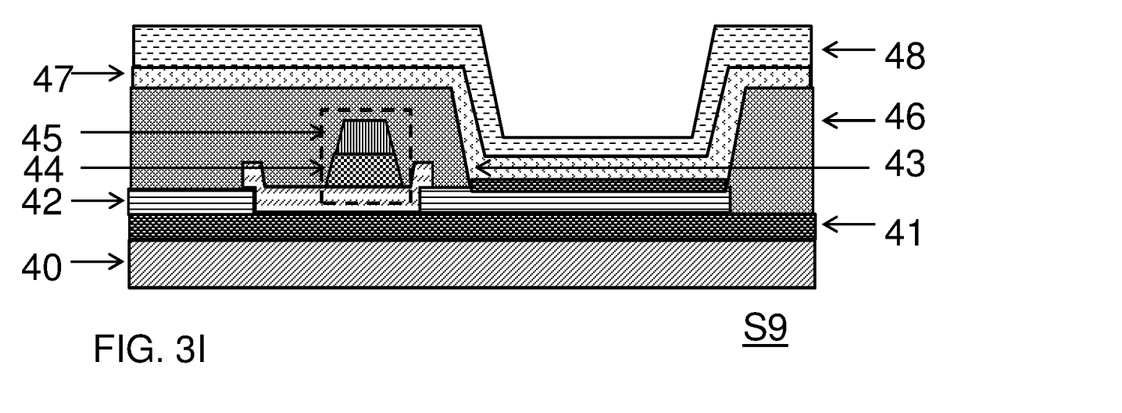

In step S9, shown in FIG. 3I, an at least substantially transparent electrically conductive layer 48 is provided over the optically active layer 47. It is noted that in addition to the steps described above other processing steps may be applied. For example intermediary layers may be provided between the layers described above or additional layers may be provided, such as a barrier layers for protection against moisture or other environmental layers and a mechanical protection layer.

Figure 3J:
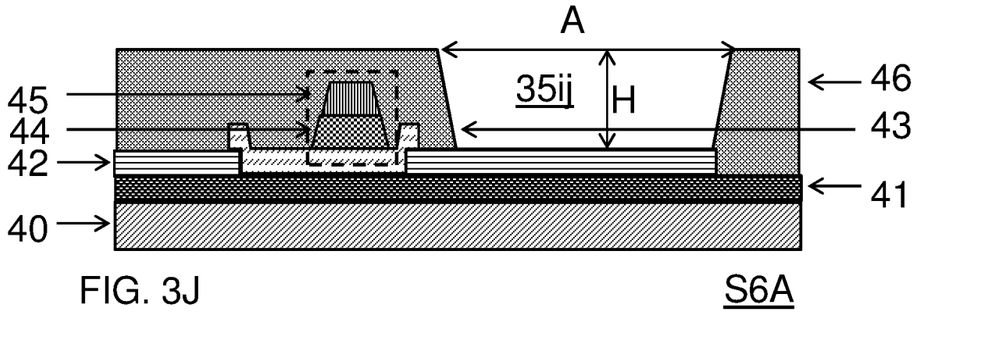
FIG. 3J-3L show subsequent alternative steps for some of the steps presented in FIG. 3A-3I.
Figure 3K:
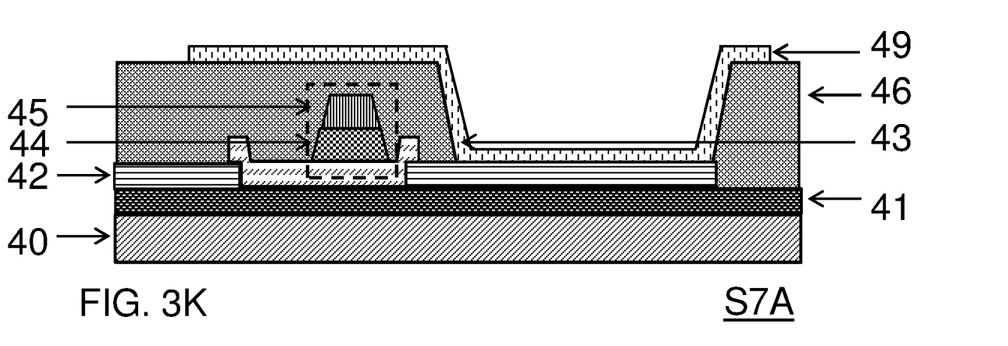
Figure 3L:
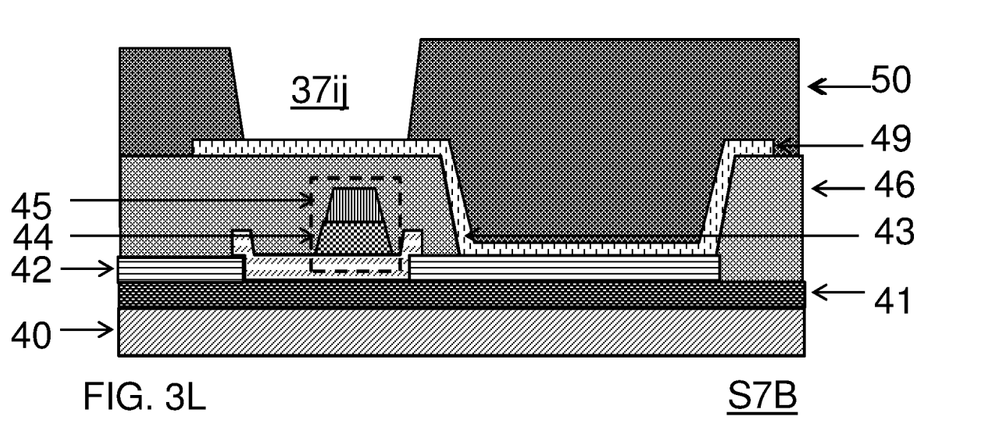

FIG. 3J-3L show alternative steps replacing steps S6, S7 of FIGS. 3F and 3G. As in step S6 of FIG. 3F, in step S6A of FIG. 3J a first intermediary patterned layer 46 is formed which is of an insulating material and defines an opening 35$ij$ extending towards the first patterned layer 45.

Subsequently, in step S7A, shown in FIG. 3K, a second patterned intermediary layer 49 of an electrically conductive material is provided. In step S7A the electrically conductive material is allowed to penetrate the opening 35$ij$ and to contact the first patterned layer 42. The electrically conductive material of the second intermediary patterned layer in the opening therewith forms a resistive element determined by the thickness D of the first intermediary patterned layer 46 and the cross-sectional area A of the opening 35$ij$ formed in step S6A.

In step S7B shown in FIG. 3L a second intermediary patterned layer 50 of an insulating material is provided that has an opening 37$ij$ extending towards the first intermediary patterned layer 49.

Step S7B may be succeeded by step S8 and S9 to apply the optically active layer 47 and the at least substantially transparent electrically conductive layer 48.

In summary, the present invention provides a photodetector array 1, that comprises a plurality of pixels 10$_{ij}$ between a supply line 4$j$ and a common electrode 2. The pixels 10$_{ij}$ comprise a respective photon radiation sensitive element 11$_{ij}$ that is arranged in a series connection with a switching element 20$ij$. The series connection further includes a resistive element 30$ij$. Therewith it is achieved that a current through the series connection is limited, even in the inadvertent case that a defect is present in a photon radiation sensitive element. Therewith also in this inadvertent case, the photodetector array is still suitable for normal use.

The photodetector array may be part of an imaging device wherein the supply line 4$j$ is one of a plurality of supply lines . . . , 4$j$–2, 4$j$–1, 4$j$, 4$j$+1, 4$j$+2, . . . and a respective plurality of pixels is coupled between each supply line and the common electrode 2. The plurality of supply lines are column lines driven by a column driver 6. The imaging device further comprises a plurality of row lines . . . , 5$i$–2, 5$i$–1, 5$i$, 5$i$+1, 5$i$+2, . . . driven by a row driver 7, wherein a respective pixel 10$ij$ of each plurality of pixels has a control electrode 23$ij$ of their switching element 20$ij$ coupled to a respective one 5$i$ of the row lines.

The imaging device may additionally comprise an image processing unit 8 configured to receive and process detection signals indicative for an intensity of photon radiation impingent on respective pixels in the photodetector array.

The image processing unit may be further configured to detect defect pixels in the photodetector array.

The image processing unit may be further configured to estimate respective detection signal for defect pixels, if those are inadvertently present.

Embodiments are applicable for use with all types of semiconductor integrated circuit ("IC") chips. Examples of these IC chips include but are not limited to processors, controllers, chipset components, programmable logic arrays (PLAs), memory chips, network chips, and the like. In addition, in some of the drawings, signal conductor lines are represented with lines. Some may be different, to indicate more constituent signal paths, have a number label, to indicate a number of constituent signal paths, and/or have arrows at one or more ends, to indicate primary information flow direction. This, however, should not be construed in a limiting manner. Rather, such added detail may be used in connection with one or more exemplary embodiments to facilitate easier understanding of a circuit. Any represented signal lines, whether or not having additional information, may actually comprise one or more signals that may travel in multiple directions and may be implemented with any suitable type of signal scheme, e.g., digital or analog lines implemented with differential pairs, optical fiber lines, and/or single-ended lines.

While the present invention has been described with respect to a limited number of embodiments, those skilled in the art will appreciate numerous modifications and variations therefrom within the scope of this present invention as determined by the appended claims.

The invention claimed is:

1. A photodetector array, comprising a plurality of pixels between a supply line and a common electrode, respective pixels comprising a photon radiation sensitive element arranged in a series connection with a switching element characterized in that the series connection further includes a resistor, which has a resistive value in the range of 0.05 to 0.4 times a reference resistive value, being defined as the median value of the resistive values of the switching elements of the respective pixels in the array in their conductive state.

2. The photodetector array according to claim 1, wherein the resistive value is in the range of 0.05 to 0.2 times the reference resistive value.

3. The photodetector array according to claim 1, wherein the resistor is a thin film resistor.

4. The photodetector array according to claim 3, wherein each thin-film resistor is provided in a vertical interconnect area of each photon radiation sensitive element.

5. An imaging device comprising the photodetector array according to claim 4, further comprising a plurality of further supply lines, wherein a respective further plurality of pixels is coupled between each further supply line and the common electrode, the plurality of further supply lines being column lines driven by a column driver, and further comprising a plurality of row lines driven by a row driver, wherein a respective pixel of each plurality of pixels has a control electrode its switching element coupled to a respective one of the row lines.

6. An imaging device comprising the photodetector array according to claim 3, further comprising a plurality of further supply lines, wherein a respective further plurality of pixels is coupled between each further supply line and the common electrode, the plurality of further supply lines being column lines driven by a column driver, and further comprising a plurality of row lines driven by a row driver, wherein a respective pixel of each plurality of pixels has a control electrode of its switching element coupled to a respective one of the row lines.

7. The photodetector array according to claim 1, wherein a controllable channel of the switching element and the resistor respectively are formed in a first and a second region of a continuous portion of a layer of semiconductor material and wherein these regions are mutually differently doped to provide that a resistive value of the first region is higher than a resistive value of the second region in a conductive state of the switching element, and lower than a resistive value of the second region in a non-conductive state of the switching element.

8. An imaging device comprising the photodetector array according to claim 7, further comprising a plurality of further supply lines, wherein a respective further plurality of pixels is coupled between each further supply line and the common electrode, the plurality of further supply lines being column lines driven by a column driver, and further comprising a plurality of row lines driven by a row driver, wherein a respective pixel of each plurality of pixels has a control electrode of its switching element coupled to a respective one of the row lines.

9. The photodetector array according to claim 1 wherein the resistor is formed as a portion of an electrically conductive element in said series connection.

10. An imaging device comprising the photodetector array according to claim 9, further comprising a plurality of further supply lines, wherein a respective further plurality of pixels is coupled between each further supply line and the common electrode, the plurality of further supply lines being column lines driven by a column driver, and further comprising a plurality of row lines driven by a row driver, wherein a respective pixel of each plurality of pixels has a control electrode of its switching element coupled to a respective one of the row lines.

11. The photodetector array according to claim 1, wherein the photon radiation sensitive elements include a photon radiation sensitive layer of an organic material.

12. The photodetector array according to claim 1, wherein the photon radiation sensitive elements are sensitive to X-ray radiation.

13. An imaging device comprising the photodetector array according to claim 12, further comprising a plurality of further supply lines, wherein a respective further plurality of is coupled between each further supply line and the common electrode, the plurality of further supply lines being column lines driven by a column driver, and further comprising a plurality of row lines driven by a row driver, wherein a respective pixel of each plurality of pixels has a control electrode of its switching element coupled to a respective one of the row lines.

14. An imaging device comprising the photodetector array according to claim 1, further comprising a plurality of further supply lines, wherein a respective further plurality of pixels is coupled between each further supply line and the common electrode, the plurality of further supply lines being column lines driven by a column driver, and further comprising a plurality of row lines driven by a row driver, wherein a respective pixel of each plurality of pixels has a control electrode of its switching element coupled to a respective one of the row lines.

* * * * *